United States Patent [19]

Mori

[11] Patent Number: 5,036,383

[45] Date of Patent: Jul. 30, 1991

[54] SEMICONDUCTOR DEVICE HAVING AN IMPROVED BONDING PAD

[75] Inventor: Seiichi Mori, Tokyo, Japan

[73] Assignee: Kabushiki Kaisha Toshiba, Kawasaki, Japan

[21] Appl. No.: 513,973

[22] Filed: Apr. 24, 1990

[30] Foreign Application Priority Data

Apr. 27, 1989 [JP] Japan .................................. 1-105912

[51] Int. Cl.$^5$ ..................... H01L 23/48; H01L 29/04; H01L 29/44

[52] U.S. Cl. ....................................... 357/71; 357/59; 357/68; 357/54; 357/67

[58] Field of Search ....................... 357/71, 59, 54, 68, 357/67

[56] References Cited

U.S. PATENT DOCUMENTS

| | | | |
|---|---|---|---|
| 4,136,434 | 1/1979 | Thibault et al. | 357/71 |
| 4,276,557 | 6/1981 | Levinstein et al. | 357/71 |
| 4,329,706 | 5/1982 | Crowder et al. | 357/71 |
| 4,398,335 | 8/1983 | Lehrer | 357/71 |
| 4,636,832 | 1/1987 | Abe et al. | 357/59 |
| 4,823,181 | 4/1989 | Mohsen et al. | 357/71 |
| 4,872,050 | 10/1989 | Okamoto et al. | 357/71 |
| 4,926,222 | 5/1990 | Kosa et al. | 357/71 |
| 4,929,988 | 5/1990 | Yoshikawa | 357/71 |

FOREIGN PATENT DOCUMENTS 59-204276 11/1984 Japan ...................................... 357/71
1-26533 5/1989 Japan .

OTHER PUBLICATIONS

S. Mori et al., "Poly-Oxide/Nitride/Oxide Structures for Highly Reliable EPROM Cells" 1984 Symposium on VLSI Technology, Sep. 10–12, 1984, pp. 1-3.

Primary Examiner—Andrew J. James
Assistant Examiner—Cynthia S. Deal
Attorney, Agent, or Firm—Finnegan, Henderson, Farabow, Garrett, and Dunner

[57] ABSTRACT

A polysilicon film is formed on an Si substrate through an insulating oxide film, and a composite film constituted by oxide and nitride films is formed on the polysilicon film. A polycide layer is formed on the composite film, and a metal electrode layer serving as a bonding pad is formed on the polycide layer through a barrier metal layer.

11 Claims, 3 Drawing Sheets

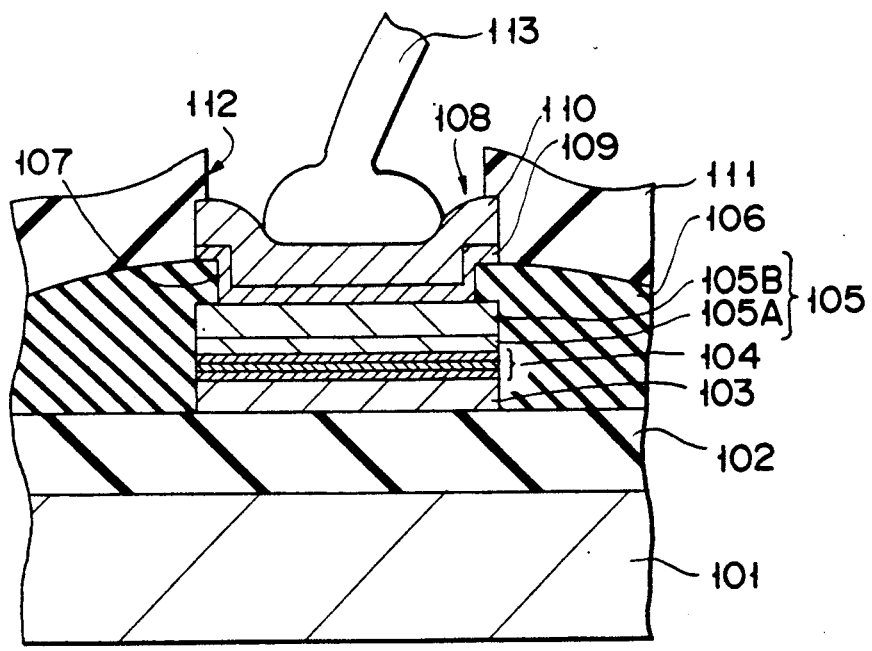
F I G. 2

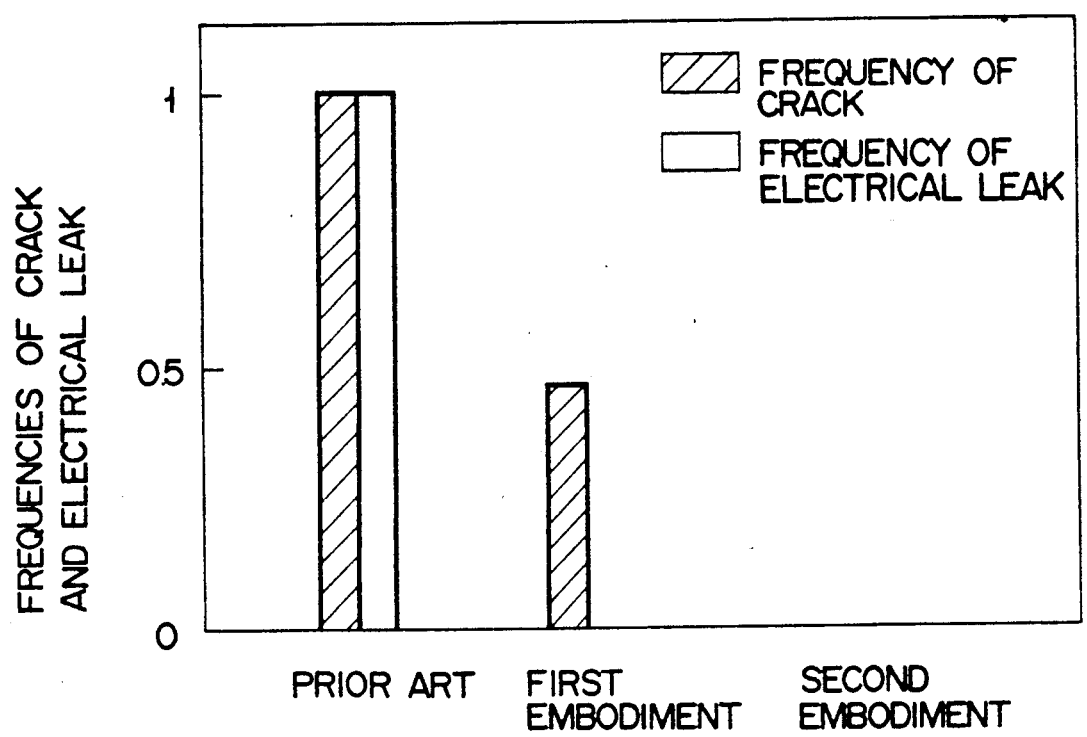
F I G. 4

SEMICONDUCTOR DEVICE HAVING AN IMPROVED BONDING PAD

BACKGROUND OF THE INVENTION

1. Field of the Invention

The present invention relates to a semiconductor device and, more particularly, to a structure of a bonding pad for connecting of elements formed on a semiconductor substrate.

2. Description of the Related Art

A portion, which bonds a metal wire to an electrode wiring layer which connects elements formed on a semiconductor substrate to each other in order to extract the electrical characteristics of these elements, has been conventionally called a bonding pad.

FIG. 1 shows an example of a structure of a conventional bonding pad.

As shown in FIG. 1, an insulating oxide film (field oxide film) 12 is formed on an Si substrate 11, and, e.g., a polysilicon layer 13 is formed on the insulating oxide film 12. Thereafter, a bonding pad 14 is formed on the polysilicon layer 13.

The bonding pad 14 has the same structure as that of a normal wiring layer, and is constituted by a barrier metal layer 15 and a metal electrode 16. A passivation film 17 is formed around the layers 15 and 16. A wire 19 is bonded to the metal electrode 16 which constitutes the bonding pad 14 through an opening 18 formed in the passivation film 17. For example, a Ti layer is used as the barrier metal layer 15, and, e.g., an Al or an Al-Si-Cu layer as an Al alloy is used as the metal electrode 16. The reason why the bonding pad 14 is formed on the polysilicon layer 13 is as follows. Since the barrier metal layer 15 such as Ti is hard to be bonded to the BPSG or PSG layer 17, if the barrier metal layer 15 and metal electrode 16 are directly formed on a commonly-used BPSG or PSG layer, they may come off.

With the above structure, however, the mechanical strength of the films between the bonding pad 14 and the Si substrate 11 is insufficient. When the wire 19 is bonded to the metal electrode 16, therefore, a crack 21 may occur in the insulating oxide film 12. For this reason, when a voltage is externally applied to the bonding pad 14 through the wire 19 in order to operate the semiconductor device, a leakage current may flow between the bonding pad 14 and the Si substrate 11.

In addition, the above-described conventional semiconductor device often has a structure wherein a BPSG (boron phosphosilicate glass) film is formed on the insulating oxide film 12. In this structure, if each of the films is thinned as the device is miniaturized, a problem similar to the above problem may occur when a wire is bonded to a bonding pad.

SUMMARY OF THE INVENTION

It is an object of the present invention to provide a semiconductor device which can prevent a crack in an insulating oxide film when a wire is bonded to a bonding pad, thus improving a withstand voltage of a bonding pad portion.

In order to achieve the above object, according to the present invention, there is provided a semiconductor device comprising:

a semiconductor substrate;

a polysilicon film formed on the semiconductor substrate with an intermediate insulating layer therebetween;

a buffer layer formed on the polysilicon film, the buffer layer including a composite film constituted by oxide and nitride films; and a metal electrode layer formed on the buffer layer, the metal electrode layer being used as a bonding pad.

According to the present invention, a hard polysilicon film with a high withstand voltage which consists of oxide and nitride films is formed between the insulating film on the semiconductor substrate and the metal electrode layer which constitutes the bonding pad. Therefore, the mechanical strength of the films between the insulating film and the metal electrode layer can be increased, and hence a crack in the insulating film can be prevented upon bonding of the wire to the bonding pad, thus improving the withstand voltage of a bonding pad portion.

Furthermore, since the insulating film has a multiple structure and the composite film constituted by the oxide and nitride films has a high withstand voltage, the withstand voltage can be maintained even when a crack occurs in a portion of the insulating film.

BRIEF DESCRIPTION OF THE DRAWING

FIG. 2 is a sectional view showing the first embodiment of the present invention;

FIG. 4 is a graph showing frequencies of a crack and a leak upon ultrasonic bonding in the first and second embodiments of the present invention, and in the prior art.

DETAILED DESCRIPTION OF THE PREFERRED EMBODIMENTS

Figure 1:
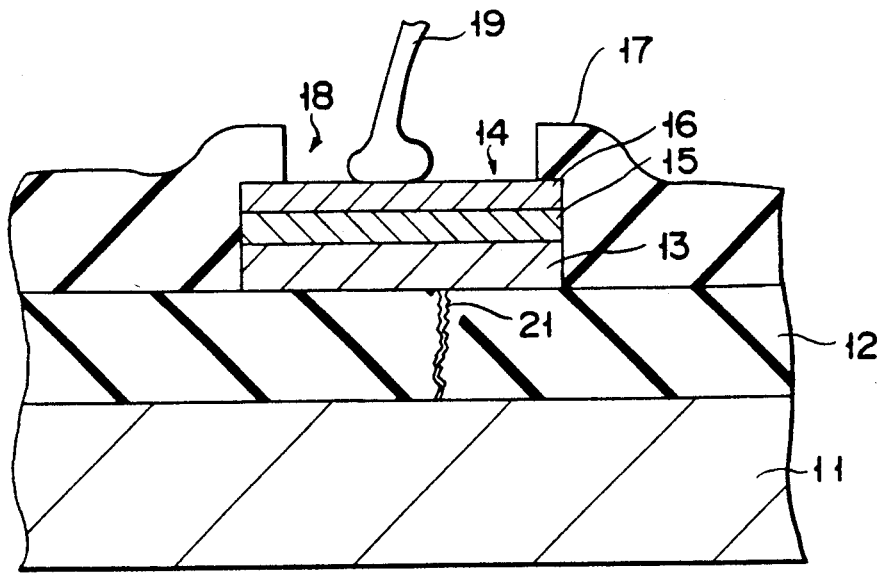
FIG. 1 is a sectional view showing a structure of a conventional bonding pad.

Embodiments of the present invention will be described hereinafter with reference to the accompanying drawings.

FIG. 2 shows the first embodiment of the present invention. In FIG. 2, the present invention is applied to a device having a two-layered gate structure such as an EPROM (electrically programmable read only memory).

An insulating oxide film 102 serving as a field oxide film is formed on an Si substrate 101 to have a thickness of, e.g., about 5,000 Å. A polysilicon film 103 serving as a floating gate (gate material for the first layer) which constitutes the EPROM is formed on the insulating oxide film 102 to have a thickness of, e.g., about 2,000 Å. A three-layered insulating film of, e.g, Oxide-Nitride-Oxide (to be referred to as an ONO insulating film hereinafter) 104 is formed as a polysilicon interlevel film on the polysilicon film 103. A polycide film 105 serving as a control gate (gate material for the second layer) which constitutes the EPROM is formed on the ONO insulating film 104 to have a thickness of, e.g., about 5,000 Å. The polycide film 105 consists of a polysilicon film 105A and a molybdenum silicide film 105B. An interlevel insulator 106 is formed on the resultant structure, and a contact hole 107 is formed in the interlevel insulator 106.

A bonding pad 108 having a two-layered structure is formed in the contact hole 107. The bonding pad 108 consists of a barrier metal layer 109 of, e.g., Ti and a metal electrode layer 110 of Al. The barrier metal layer 109 is formed on the molybdenum silicide film 105B to have a thickness of about 500 Å, and the metal electrode layer 110 is formed on the barrier metal layer 109 to have a thickness of, e.g., about 8,000 Å.

A passivation film 111 is formed on the resultant structure, and a wire 113 is bonded to the metal electrode layer 110 by ultrasonic waves through an opening 112 formed in the passivation film 111.

For example, a PSG or BPSG (borophosphosilicate glass) film is used as the interlevel insulator 106, and, e.g., a PSG or SiN film is used as the passivation film 111.

In the bonding pad with the above structure, the hard ONO insulating film 104 is formed between the soft polysilicon layers 103 and 105A, and the resultant structure is formed between the bonding pad 108 and the insulating oxide film 102. Therefore, the mechanical strength between the bonding pad 108 and the insulating oxide film 102 can be improved, and hence any impact which occurs upon bonding of the wire 113 to the bonding pad 108 can be reduced by the polysilicon layers 103 and 105A, and the ONO insulating film 104. Therefore, a crack in the insulating oxide film 102 can be prevented, and a leakage current can also be prevented.

In addition, the ONO insulating film 104 has an extremely high insulating withstand voltage. Even if a crack occurs in the insulating oxide film 102, therefore, a leak from the bonding pad 108 into the Si substrate 101 can be prevented if a crack does not occur in the ONO insulating film 104. Therefore, a highly reliable semiconductor device can be provided.

Furthermore, since the two polysilicon layers 103 and 105A are formed below the bonding pad 108, the thickness of the layer under the bonding pad 108 is increased. Therefore, the mechanical strength can be improved, and hence cracking upon bonding can be prevented, and ingress of water or impurities such as mobile ions into the crack can be prevented.

Figure 3:
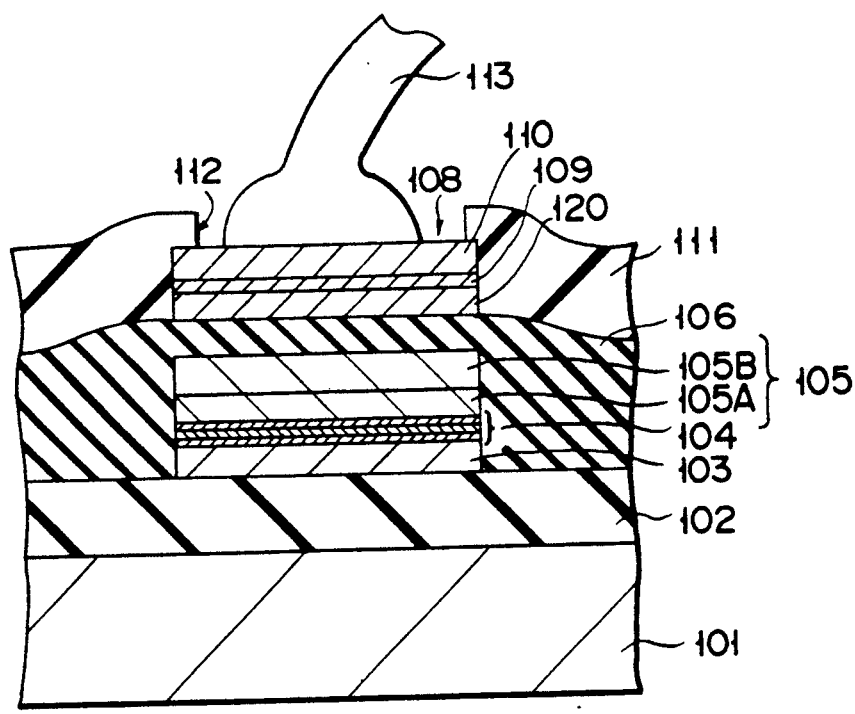
FIG. 3 is a sectional view showing the second embodiment of the present invention.

The second embodiment of the present invention will be described hereinafter with reference to FIG. 3. The same reference numerals in FIG. 3 denote the same parts as in FIG. 2.

In the second embodiment, the mechanical strength of the bonding pad portion is greater than that in the first embodiment.

An insulating oxide film 102, a polysilicon film 103, an ONO insulating film 104, and a molybdenum silicide polycide film 105 which are sequentially formed on an Si substrate 101 are the same as those in the first embodiment.

In the second embodiment, an interlevel insulator 106 consisting of, e.g., a PSG or BPSG film is formed on the resultant structure, and a polysilicon layer 120 having a thickness of about 1,000 Å is formed on the interlevel insulator 106 as a material for the third layer. A barrier metal layer 109 of Ti is formed on the polysilicon layer 120, and a metal electrode layer 110 of Al is formed on the barrier metal layer 109. A passivation film 111 is formed on the resultant structure, and a wire 113 is bonded to the metal electrode 110 by ultrasonic waves through an opening 112 formed in the passivation film 111.

According to the second embodiment, the hard ONO insulating film 104 is formed between the soft polysilicon layers 103 and 105A in the same manner as in the first embodiment. In addition, the interlevel insulator 106 and the polysilicon layer 120 are formed above the resultant structure. Therefore, the film thickness is larger than that of the first embodiment, and hence the mechanical strength can be further improved. When a wire is bonded to a bonding pad 108, a crack can be prevented. Therefore, a leak from the bonding pad 108 into the Si substrate 101 can be prevented with higher reliability.

In addition, since the ONO insulating film 104 having an extremely high insulating withstand voltage is used, a leak can be reliably prevented, thus providing a highly reliable semiconductor device.

FIG. 4 shows a frequency of a crack in a film which is present between the bonding pad and the semiconductor substrate upon ultrasonic bonding, and a frequency of a leak which occurs between the bonding pad and the semiconductor substrate when a voltage is applied to the bonding pad, in the first and second embodiments of the present invention, and in the prior art.

In FIG. 4, the axis of ordinate represents frequencies of a crack and leak, and these frequencies in the prior art are defined as "1". In the first embodiment, the frequency of a crack is about "0.5", and is decreased to be half that in the prior art. The frequency of a leak is "0". In the second embodiment, the frequencies of a crack and leak are "0".

As described above, according to the present invention, the withstand voltage of the bonding pad portion is higher than that in the prior art. In particular, in the structure of the bonding pad portion in the second embodiment, when the interlevel insulator 106 and the polysilicon layer 120 are formed, the film thickness is increased as compared with that in the first embodiment, and the withstand voltage can be further increased, thus obtaining a highly reliable semiconductor device.

Figure 5:
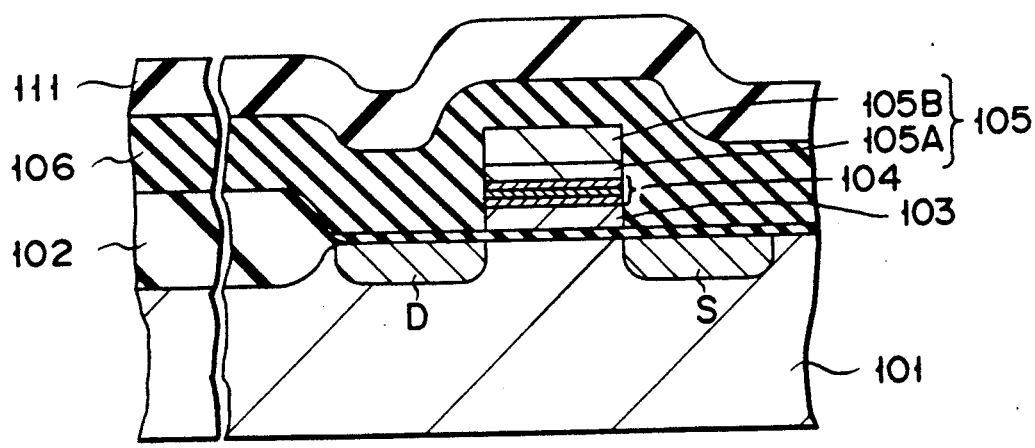
FIG. 5 is a sectional view showing an EPROM to which the present invention is applied.

FIG. 5 shows an EPROM to which a bonding pad according to the present invention is applied. The same reference numerals in FIG. 5 denote the same parts as in the first and second embodiments.

Thus, e.g., the polysilicon films 103 and 105A, and the ONO insulating film 104 can be formed at the same time that the EPROM is manufactured, so that the manufacturing steps of the EPROM need not be changed. Therefore, the semiconductor device of the present invention is extremely advantageous to manufacture.

Note that although an EPROM is exemplified and described in the above embodiments, the present invention is not limited thereto, and can be applied to a semiconductor device having a multilayer gate structure.

In addition, although the gate material 103 for the first layer is polysilicon, the gate material 105 for the second layer is a polycide, and the material for the third layer 120 is polysilicon in the above embodiment, the materials are not limited thereto.

Furthermore, each material for the first and second, may have a multilayer structure such a polycide structure consisting of two or more layers.

Moreover, although the ONO insulating film is used as the insulating film between the two gate layers in the above embodiments, the insulating film is not limited to this, and, e.g., an NO film or an ONON film can be used.

Although Ti is used as the barrier metal layer another material such as W or TiN/Ti can be used.

Note that the present invention is not limited to the above embodiments, and various changes and modifications may be made without departing from the spirit and scope of the invention, as a matter of course.

What is claimed is:

1. A semiconductor device comprising:
   a semiconductor substrate;
   a first insulating layer formed on said semiconductor substrate;
   a polysilicon film formed on said first insulating layer;
   a second insulating layer formed on said polysilicon film, said second insulating layer including a composite film including oxide and nitride films;
   a polysilicon layer formed on said second insulating layer; and
   a metal electrode layer formed over said second polysilicon layer, said metal electrode layer being used as a bonding pad for bonding a wire thereon.

2. A device according to claim 1, further comprising a silicide layer formed between said polysilicon layer and said metal electrode.

3. A device according to claim 2, further comprising a barrier metal layer formed between said silicide layer and said metal electrode.

4. A device according to claim 2, wherein said silicide layer comprises molybdenum silicide.

5. A device according to claim 1, further comprising a barrier metal layer formed between said polysilicon layer and said metal electrode.

6. A semiconductor device comprising:
   a semiconductor substrate;
   an insulating layer formed on said semiconductor substrate;
   a first polysilicon layer formed on said insulating layer;
   a composite film formed on said first polysilicon layer, said composite film including oxide and nitride films;
   a polycide layer formed on said composite film;
   an interlevel insulator formed over said insulating layer and said polycide layer;
   a second polysilicon layer formed on said interlevel insulator; and
   a metal electrode layer, formed over said second polysilicon layer, constituting a bonding pad for bonding a wire thereon.

7. A device according to claim 6, further comprising a barrier metal layer formed between said second polysilicon layer and said metal electrode layer.

8. A device according to claim 6, wherein said polycide layer comprises:
   a third polysilicon layer formed on said composite film; and
   a molybdenum silicide layer formed on said third polysilicon layer.

9. A semiconductor device comprising:
   a semiconductor substrate;
   an insulating layer formed on said semiconductor substrate;
   a polysilicon film formed on said insulating layer;
   a composite film formed on said polysilicon film, said composite film including oxide and nitride films;
   a polycide layer formed on said composite film; and
   a metal electrode layer, formed over said polycide layer, constituting a bonding pad for bonding a wire thereon.

10. A semiconductor device comprising:
    a semiconductor substrate;
    an insulating layer formed on said semiconductor substrate;
    first polysilicon layer formed on said insulating layer;
    a composite film formed on said first polysilicon layer, said composite film including oxide and nitride films;
    a second polysilicon layer formed on said composite film;
    an interlevel insulator formed over said insulating layer and said second polysilicon layer;
    a third polysilicon layer formed on said interlevel insulator; and
    a metal electrode layer, formed over said third polysilicon layer, constituting a bonding pad for bonding a wire thereon.

11. A device according to claim 10, further comprising a barrier metal layer formed between said third polysilicon layer and said metal electrode.

* * * * *